Figure 1:
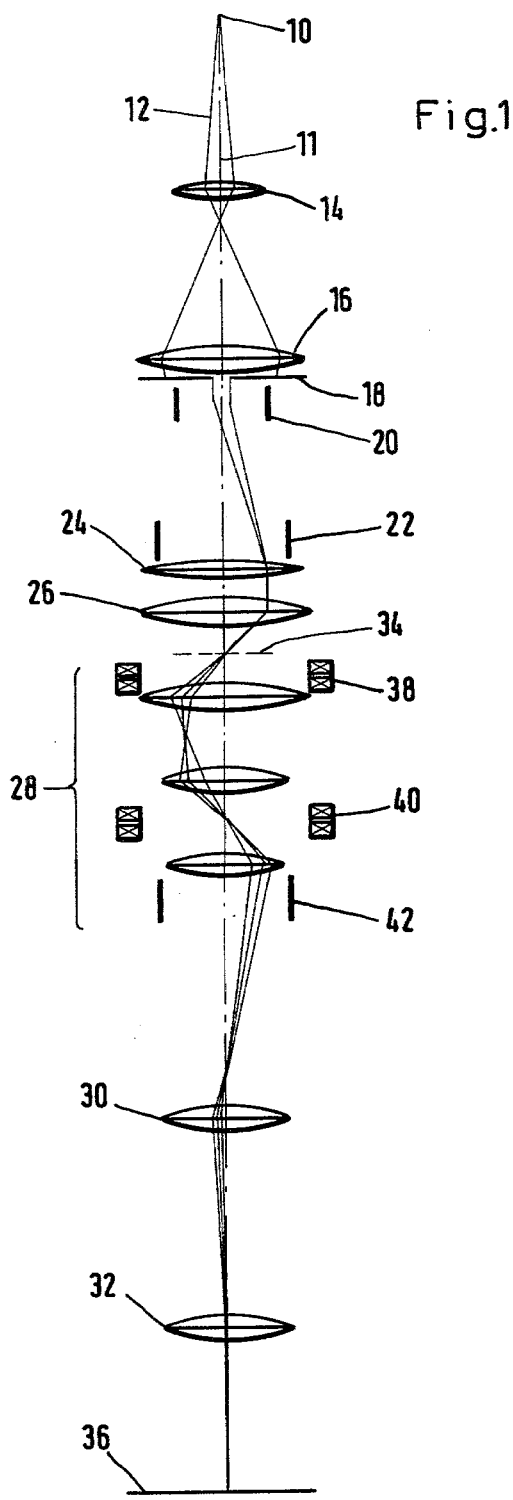

United States Patent [19]

Hoppe et al.

[11] 4,214,162
[45] Jul. 22, 1980

[54] CORPUSCULAR BEAM MICROSCOPE FOR RING SEGMENT FOCUSING

[75] Inventors: Walter Hoppe, Lochham; Dieter Typke, Gauting, both of Fed. Rep. of Germany

[73] Assignee: Max-Planck-Gesellschaft zur Förderung der Wissenschaften e.V., Göttingen, Fed. Rep. of Germany

[21] Appl. No.: 883,005

[22] Filed: Mar. 3, 1978

Related U.S. Application Data

[63] Continuation of Ser. No. 724,056, Sep. 16, 1976, abandoned.

[30] Foreign Application Priority Data

Sep. 19, 1975 [DE] Fed. Rep. of Germany ....... 2541915

[51] Int. Cl.² ............................................. H01J 37/26
[52] U.S. Cl. ............................ 250/311; 250/396 ML
[58] Field of Search ............... 250/306, 307, 305, 310, 250/311, 396 ML, 397, 398, 399

[56] References Cited

U.S. PATENT DOCUMENTS

| | | | |
|---|---|---|---|
| 2,464,419 | 3/1949 | Smith | 250/307 |
| 3,660,657 | 5/1972 | Brookes | 250/311 |
| 3,889,114 | 6/1975 | Van Oostrum | 250/311 |
| 3,916,201 | 10/1975 | Herrmann et al. | 250/396 ML |
| 3,924,126 | 12/1975 | Anderson | 250/311 |
| 3,978,338 | 8/1976 | Ueno | 250/311 |

Primary Examiner—Bruce C. Anderson
Attorney, Agent, or Firm—Ladas & Parry

[57] ABSTRACT

A corpuscular beam microscope for ring segment focusing is provided with a condenser and an objective magnetic lens system which is disposed substantially axially symmetrically about the microscope axis for the purpose of generating two field maxima separated by a distance not exceeding five times the arithmetic means of half the half height widths of the component magnetic fields forming the maxima. The provision of such a magnetic lens system facilitates the elimination of aperture aberrations of the first and second order and the elimination of chromatic aberrations of zero order and partly of the first order as well as certain extra-axial defects.

6 Claims, 8 Drawing Figures

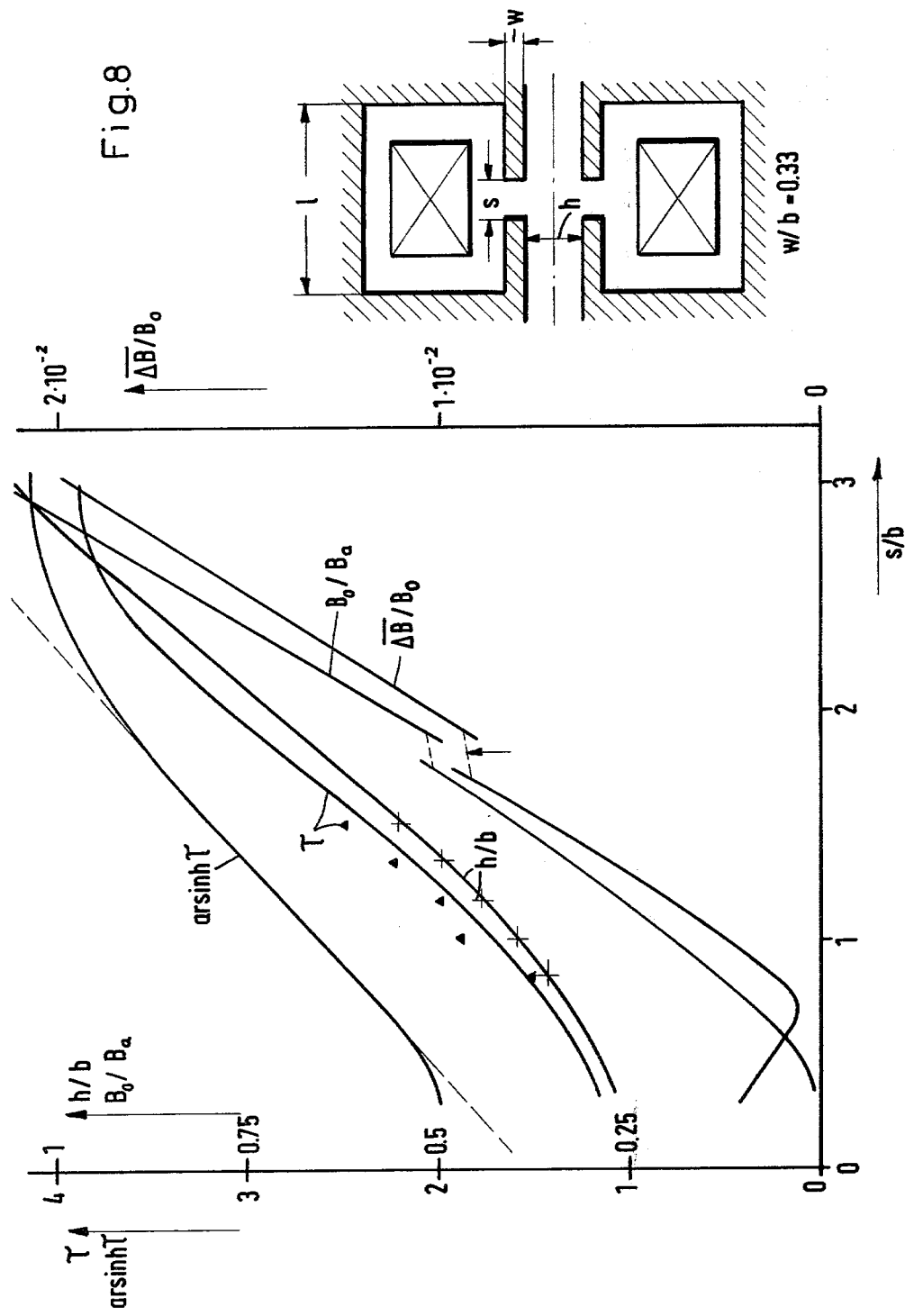

CORPUSCULAR BEAM MICROSCOPE FOR RING SEGMENT FOCUSING

This is a continuation of application Ser. No. 724,056 filed Sept. 16, 1976 abandoned.

The present invention relates to a corpuscular beam microscope comprising means for the production of at least one corpuscular beam which is confined to one segment of an annular zone substantially concentrically surrounding the microscope axis, and which is inclined at an angle of at least 30° to the microscope axis at the point thereon where an object of which a magnified image is desired is located, a corpuscular optical lens system which in the path of the corpuscular beam contains at least one illuminating condenser preceding the object and a further reproducing lens system following the object, which latter system includes at least one objective (and usually also an intermediate lens and a projector lens), at least one stigmator system for correcting image defects in the ring segment section corpuscular beam, an object molder and an image recording means disposed in the final image plane.

A corpuscular beam microscope of such a kind is described in the as-filed published specification of German Patent Application No. 21 65 089. The instrument is intended more particularly for taking several images of an object at angles of irradiation distributed over as large a solid angle as possible. From such photographs the three-dimensional density distribution of the object can be reconstructed, as described for instance in the papers published by W. Hoppe and D. J. DeRosir et al. (for instance in Naturwissenschaften 55 (1968), pp.333 to 336; Optik 29 (1969) pp.617 to 621; Nature 217, (1968) pp.130–133 and J. Mol. Biol. 52 (1970), pp.355–369).

In order to permit a high image resolution to be obtained image defects must be corrected as far as may be possible. This can be done without major difficulties by providing in each path of the beam of the different irradiating directions a substantially independent corpuscular optical reproducing system. On the other hand, with a view to simplifying the complexity of the apparatus it is desirable to provide a common corpuscular optical reproducing system for all the paths of the beam and to make separate provision in each path merely for correcting the image defects.

The present invention contemplates a corpuscular beam microscope for ring segment focusing, as above specified, and seeks to improve such a corpuscular beam microscope with respect to the correction of image defects.

This object is achieved by the inventive features defined in claim 1.

By the provision of a condenser and an objective lens system having at least two closely consecutive field maxima in a corpuscular beam microscope for ring segment focusing it is possible more particularly to eliminate aperture aberrations of the first and second order, chromatic aberration of zero order and partly of the first order as well as certain extra-axial defects. In embodiments providing a plurality of paths for a beam confined in cross section to ring segments, the said paths together defining the surface of a cone, the invention yields a very compact and relatively simple structural design which is of particular advantage when making use of super-conducting shielding lenses.

Figure 2:
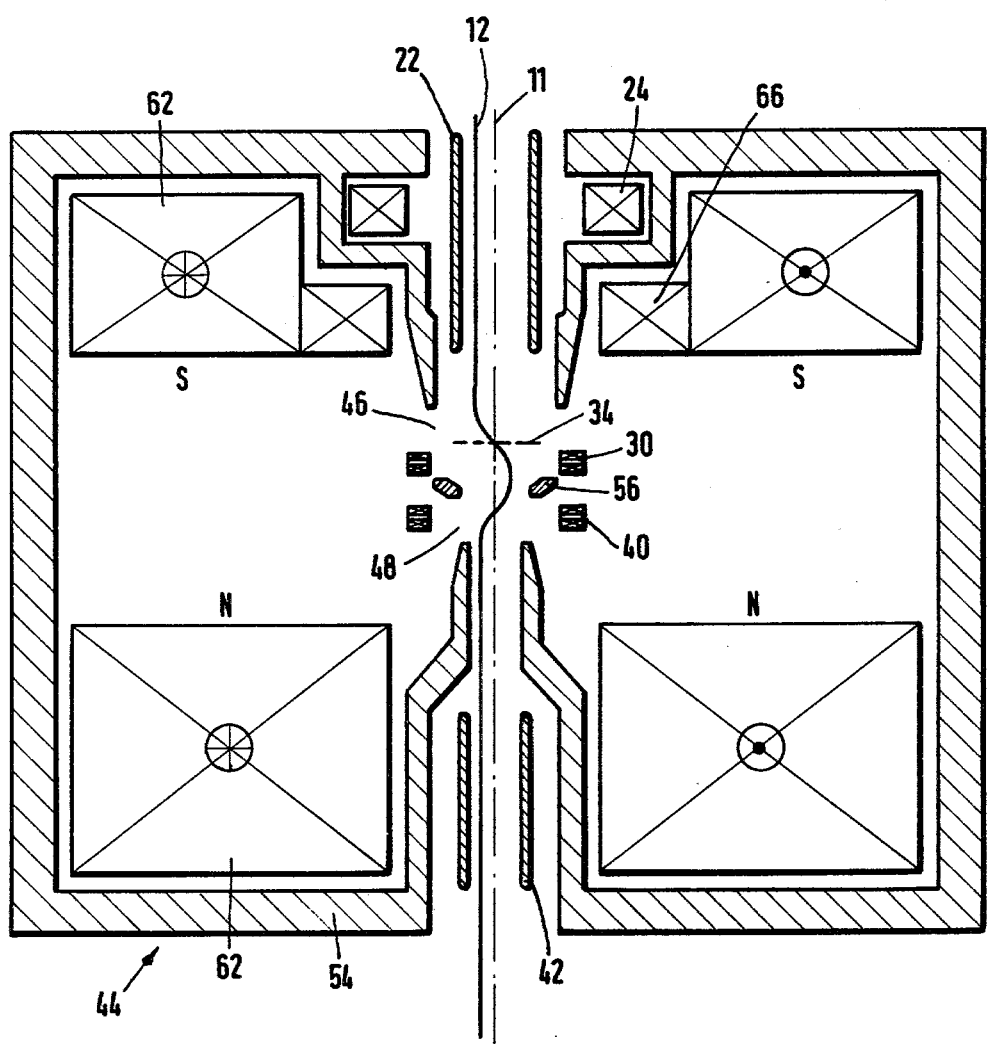
Figure 3:
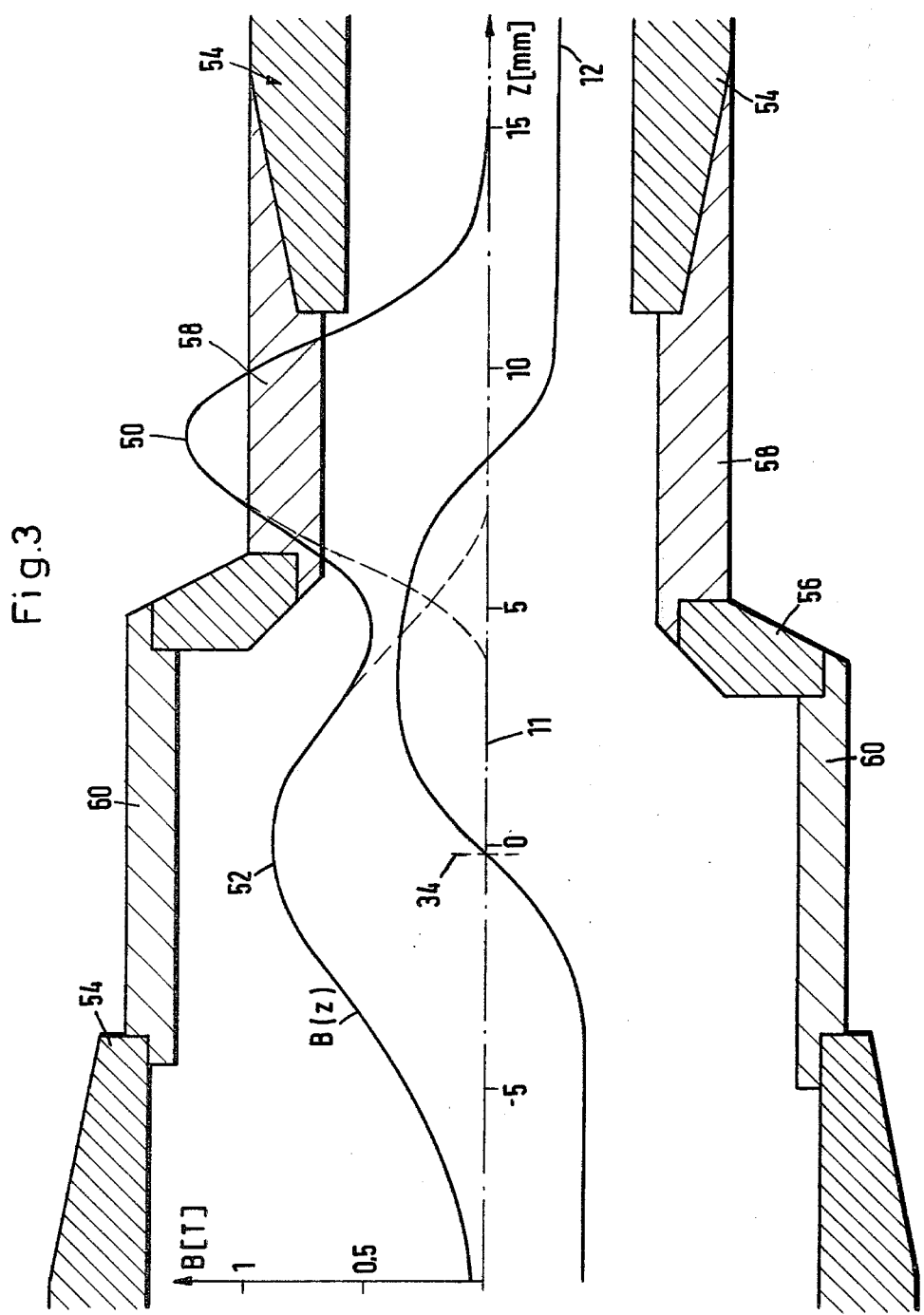
Figure 4:
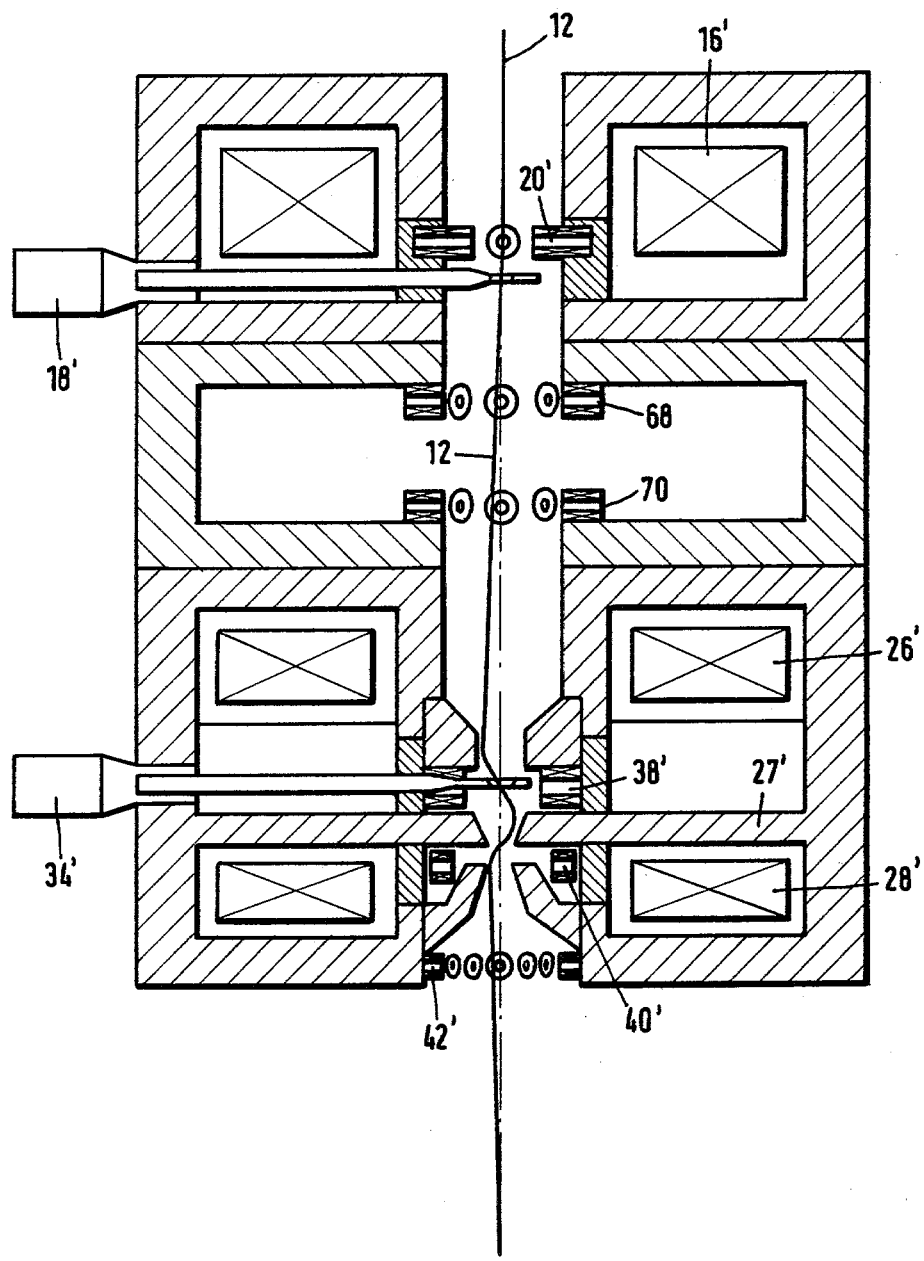
Figure 5:
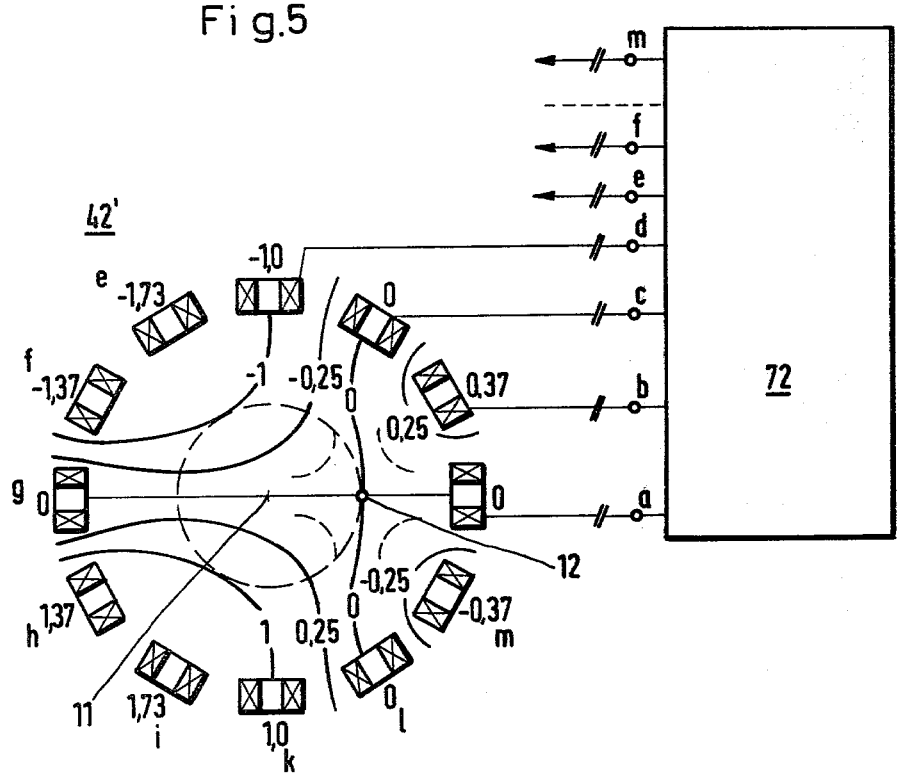
Figure 6:
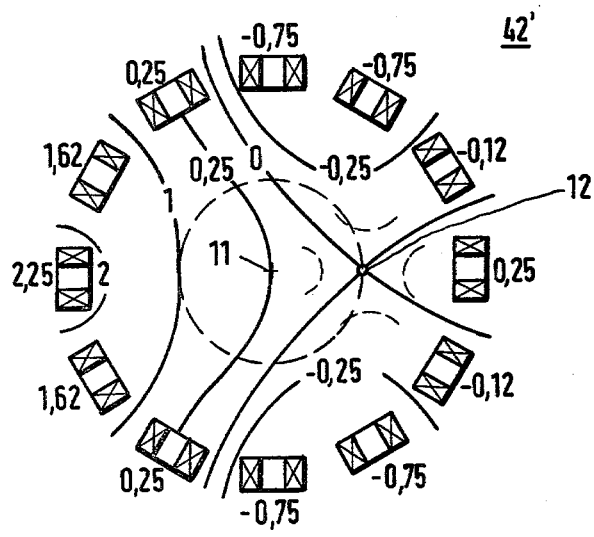
Figure 7:
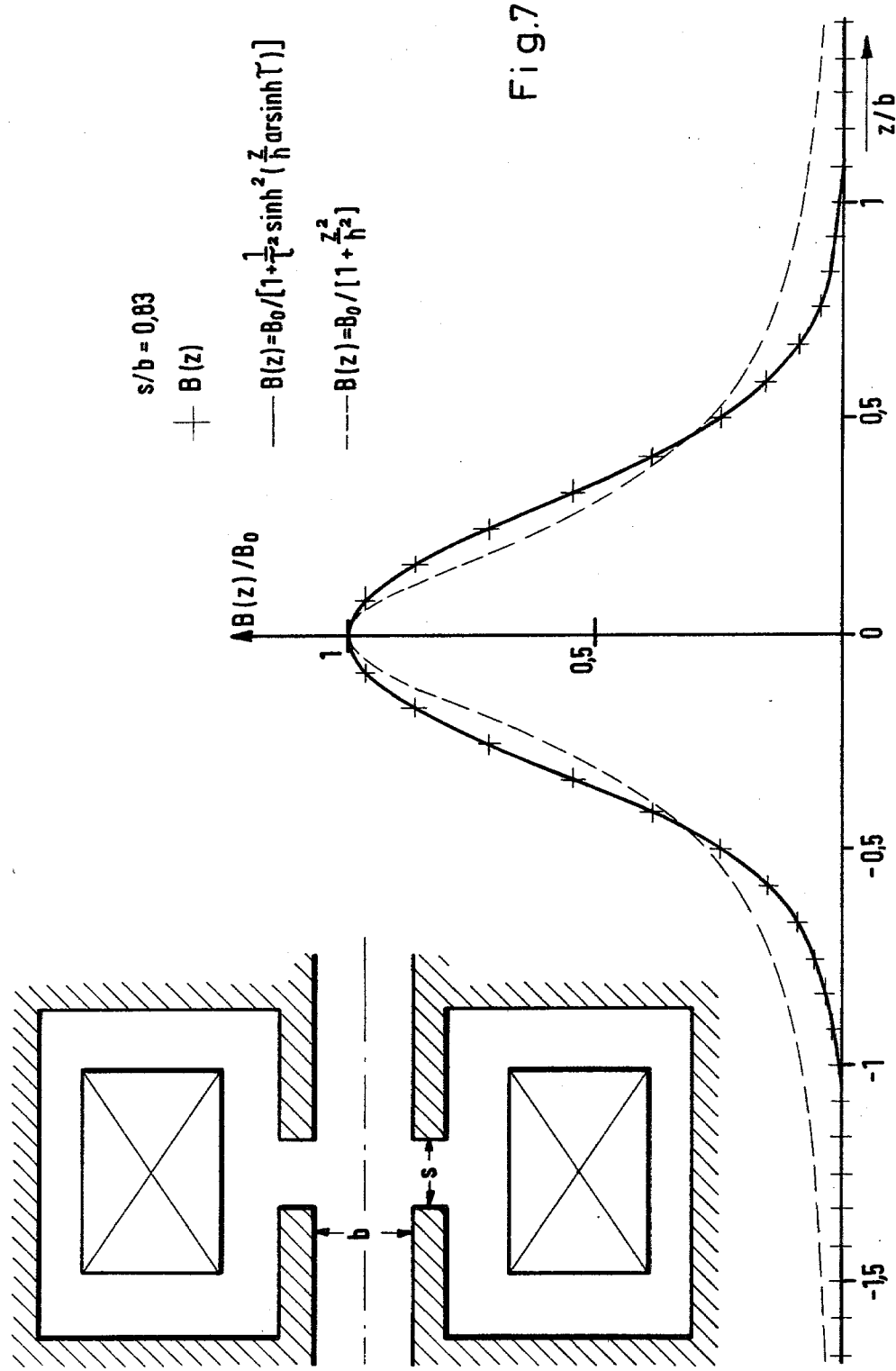

Embodiments of the invention will now be more particularly described with reference to the drawing in which FIG. 1 is a diagrammatic representation of a path of the beam in an electron microscope according to the invention, FIG. 2 is a more detailed representation of a superconductor shielding lens system for an electron microscope according to the invention, FIG. 3 is an enlarged representation of part of the lens system in FIG. 2 and of the magnetic field distribution generated by the system, FIG. 4 is a sectional representation of part of another embodiment of an electron microscope according to the invention FIG. 5 is a diagrammatic representation of a stigmator arrangement for a corpuscular beam microscope according to the invention, FIG. 6 is a representation of another method of operating the stigmator system in FIG. 5, and FIGS. 7 and 8 are graphs to assist in an understanding of the method of calculating the lens fields for a lens system according to FIGS. 2 and 3.

The following particular description relates to electron beam microscopes although the scope of the invention is not intended to be limited to this type of microscope, since it is clearly just as readily applicable to ion microscopes.

In FIG. 1 a path of the electron beam in an embodiment of the electron microscope according to the invention is schematically shown. The illustrated electron microscope comprises an electron source 10 which is only diagrammatically shown, and which may be of conventional kind, preferably containing a field emission cathode. The electron source 10 emits an electron beam 12 which along the length of the microscope axis consecutively passes through a first magnetic condenser 14, a second magnetic condenser 16, an illuminating field diaphragm stop 18, an electrostatic deflecting system 20, only two of the four deflecting plates being shown, permitting the electron beam to be deflected in any desired direction away from the microscope axis 11 into any one of a number of different discrete paths, an illumination stigmator 22 which in practice is needed when a very small part of a specimen (less than 1 micron diameter) is to be illuminated at apertures of $10^{-4}$ to $10^{-3}$, a magnetic adapter lens 24, an illuminating condenser 26, an objective 28, an intermediate lens 30 and an image projector 32. The image projector 32 projects a magnified image of an object 34 disposed between the illuminating condenser 26 and the objective 28 in a final image plane 36 in which image recording equipment is provided, such as a photographic plate or an electronic picture recording device comprising an image converter or a television camera tube and the like as is conventional the electron beam travels in a vacuum.

Two field correctors 38 and 40 and one stigmator system 42 are associated with the objective 28. The field correctors 38 and 40 contain a plurality (e.g. 8 or 16) small magnet coils disposed with their axes distributed radially about the microscope axis 11 and designed to generate a multipole field. The correction relates to the totality of the circular magnetic lenses forming the objective and is therefore the same for all beam paths that can be selected by control of the deflecting system 20. In practice the electron beam will always be deflected by the deflecting system 20 at the same angle to the microscope axis but in different azimuthal directions about the microscope axis, so that the centre axes of the different paths intersect at a specific point in the object 34 and define the surface of a cone which has its verbex at the said point of intersection.

Contrary to the field correctors 38 and 40 the stigmators 22 and 42 which are only schematically shown in FIG. 1 serve for individually correcting the electron beam in the different paths. The stigmators 22 and 42 in the embodiment according to FIG. 1 contain a plurality of electrodes which may have the form of axially oriented strip-like zones on the circumferential surface of a cylinder, and which in conventional manner are electrically energisable to produce an electrostatic multipole field. The illumination stigmator 22 is preferably an electric octopole, whereas the stigmator 42 likewise comprises at least 8, but preferably 16 or more electrodes.

The potentials at the electrodes of the stigmators 22 and 42 are transferred from electrode to electrode jointly with the deflection of the beam by the deflecting system 20 and they are calculated for each path so that the desired beam correction is achieved.

FIGS. 2 and 3 illustrate in somewhat greater detail an embodiment of that part of the electron microscope in FIG. 1 which comprises the illumination stigmator 22, the adapter lens 24, the illuminating condenser 26, the objective 28, the object 34, the field correctors 38 and 40 as well as the stigmator 42. The illuminating condenser 26 and the objective 28 are formed by a superconductor shielding lens 44 containing two annular gaps 46 and 48 hich produce a magnetic field B(z), i.e. a field strength B in Tesla (T) units as a function of z (the z-coordinate), having two maxima 50 and 52 (FIG. 3). The shielding lens comprises a casing 54 of superconducting material, such as a sinter body of Nb$_3$Sn, or some other hard superconductor. The gaps 46 and 48 are separated by an intermediate superconducting ring 56. In practice the gaps 46 and 48 are sealed in vacuum tight manner by annular members 58 and 60 (FIG. 3) which consist of a material that is not superconducting at operating temperature (e.g. copper). Apart from forming a seal the members 58 and 60 also serve for mechanically supporting and for cooling the intermediate ring 56.

The casing 54 contains a system of magnetic coils which superconduct during operation, preferably comprising at least the principal coils 62 and 64, usually codirectionally energised, and at least one correcting coil 66. By an appropriate choice of the size, disposition and energisation of the coils 62, 64 and 66 in conjunction with the design dimensions of the gaps 46 and 48 and of the intermediate ring 56, a large number of parameters are available to enable a desired field distribution to be achieved.

FIG. 4 shows part of a different embodiment of an electron microscope according to the invention. The illustrated portion corresponds roughly to the zone extending from the second condenser 16 to the intermediate lens 30 in FIG. 1 and contains a ferromagnetic circular lens 16' which corresponds to the second condenser lens 16 in FIG. 1, an electromagnetic deflecting system 20' containing four deflecting coils, an exchangeable and adjustable illumination field diaphragm 18', two consecutive ferromagnetic circular lenses 26', 28' which provide the magnetic field for the illuminating condenser and the objective, an object holder 34', field correctors 38' and 40', as well as an electromagnetic stigmator system 42' which will be later described in greater detail with reference to FIGS. 5 and 6. The circular lenses 26' and 28' share a common field plate 27' and thus form a "double-gap lens" similar to that in FIGS. 2 and 3, permitting a magnetic field having two closely neighbouring maxima to be generated, as illustrated in FIG. 3.

The expression "closely neighbouring" is intended to mean that the distance between the field maxima 50, 52 does not exceed three to five times the arithmetic mean of half the half height widths of the magnetic component fields forming the maxima. These component magnetic fields are each produced in an embodiment according to FIGS. 2 and 3 by a gap 58, 60, and in the embodiment according to FIG. 4 by the circular lenses 26' and 28'. The component magnetic fields are represented in FIG. 3 by the chain line curves.

Between the circular lens 16' forming the second condenser and the circular lens 26' two additional arrays 68 and 70 may be provided, as shown in FIG. 4, for the creation by each of a magnetic multipole field, functionally roughly analogous to the illumination stigmator 22 in FIG. 2.

In FIG. 5 the coils of the stigmator 42' are shown in a section across the principal microscope axis. Each coil is connected to the corresponding terminal of a programme-controlled power source 72 which sends a specified current through each coil in respect of each path of the beam that has been preselected by the deflecting system 20. For each path the current is separately controlled and in routine operation the programme-controlled power source 72 will then supply exactly the correct current for each path of the beam. Moreover, in FIG. 5, a possible magnetic potential field is illustratively shown which provides a magnetic quadrupole having the desired parameters when the electron beam is in position 12.

FIG. 6 is another possible magnetic potential distribution for the production of a stigmator quadrupole.

In the Table at the end of the specification ten sets of parameters for a system of two magnetic circular lenses of the kind described with reference to FIGS. 2 and 4 are listed.

The lens system is described by the magnetic field strength B$_{(z)}$ along the microscope axis 11, viz. by $$B_{(z)} = \sum_{i=1}^{2} \frac{B_{oi}}{1 + \frac{1}{\tau_i^2} \sinh^2(\frac{z - z_{Li}}{h_i} \sinh^{-1}\tau_i)}$$

For values of $\tau$ between 1 and 3 a field of this geometry can be well realised with ferromagnetic lenses or superconducting shielding lenses having several gaps. The position $z_B$ of for instance the first stigmatic intermediate image (cf. FIG. 1) is 150 mm · $f_L$.

The values in the Table are calculated for an accelerating voltage V=100 kV.

The relativistically corrected accelerating voltage is $V^* = V + eV^2/2m_0c^2$. For V=100 kV this gives $V_{100}^* = 109.885$ kV.

For $V_x^* \neq 100$ kV it follows that $V_x^* = 109.885 \cdot f_{V^*}$; ($f_{V^*} = V_{x^*}/V_{100^*}$. The meanings of the symbols in the Table are as follows:

$B_{oi}$ = maximum field strength along the axis of the component field produced by the gap in question ("gap component");

$z_{Li}$ = position of the $i^{th}$ field maximum of the $i^{th}$ gap component related to the first maximum ($z_{L1}=0$) in the direction of the beam;

$h_i$ = half the half height width of the $i^{th}$ gap component;

$\tau_i$ = shape parameter of the $i^{th}$ gap component (cf. FIG. 8);

$\sigma_o$ = angle of the beam axis to the microscope axis at the object;

V = electron accelerating voltage;

$z_Q$ = *location of source image (illuminating field diaphragm 18).*

The systems having the data given in the Table yield an image which is free from aperture aberrations to inclusive of the 2nd order and from chromatic aberration of zero order. The specified systems can be modified by imparting values different from unity to the factors $f_L$, $f_B$ and $f_V$* contained in the lengths, inductions and accelerating voltages, whilst simultaneously keeping the expressions $f_L \cdot F_B / \sqrt{f_V} = 1$. The modified systems have the same properties as the original systems.

System No. is so calculated that the object can be illuminated by a light source (illumination field stop 18) at $z = -500$ mm·$f_L$* at an angle of 45° by cutting down to a narrow pencil of light. In the other system $z_Q$ is substantially closer to the first lens of the illuminating field condenser-objective system.

A comparison of the parameters of the system Nos. 1 to 5 shows that the above conditions can also be satisfied by varying the shape parameters $\tau_i$, the angle $\sigma_o$ or the object plane $Z_G$. This enables an image to be adjusted having a minimum of defects, even if the data stated in the Table are not exactly attained because of manufacturing tolerances and other sources of error.

Systems 1 to 5 in the Table use fields of the type indicated in FIG. 7 by the full line curve. This type of field has an exponential distribution and it corresponds to a value $\tau$ roughly equal to 1. The systems 6 to 10 use a Glaser bell field, as represented in FIG. 7 by the chain line curve. Such a field is obtained for $\tau \to 0$.

FIG. 8 shows the relationship between the shape parameter $\tau$ and the dimensional parameters b, l, s and w of a magnetic ring lens having a single gap. The meaning of the dimensional parameters will be understood from the diagram in FIG. 8 on the right. FIG. 8 holds only as a first approximation for a circular lens having several gaps, since the fields due to the different gaps do to some extent mutually interfere.

In a calculation of the system parameters, as shown in the Table, a model field which satisfies the prescribed imaging conditions is determined first. Based on the field parameters (field strength, spacing and half height width of the field maxima) the design parameters of the lenses, for instance the shape of the superconducting surfaces of the shielding lens in FIGS. 2 and 3 are then determined by a potential programme.

TABLE

Parameter families for a system comprising two magnetic circular lenses using conical intercept focusing and providing freedom from zero order chromatic aberration
The lens system is defined by the induction $B_{(z)}$ on the scale:

$$B_{(z)} = \sum_{i=1}^{2} \frac{B_{oi}}{1 + \frac{1}{\tau_i^2} \sinh^2\left(\frac{z - z_{Li}}{h_i} \sinh^{-1}\tau_i\right)}$$

Accelerating voltage of the beam electrons 100 kV.

| System No. | $z_G$/mm | $\sigma_O$ | $B_{O1}$/T | $B_{O2}$/T | $z_{L1}$/mm | $z_{L2}$/mm | $h_1$/mm | $h_2$/mm | $\tau_1$ | 2 |
|---|---|---|---|---|---|---|---|---|---|---|
| 1 | $-0.16000 \cdot f_L$ | 45° | $0.89375 \cdot f_B$ | $1.19021 \cdot f_B$ | 0.0 | $8.4631 \cdot f_L$ | $4.0000 \cdot f_L$ | $2.2535 \cdot f_L$ | 1.05 | 1.10 |
| 2 | 0.0 | 45° | $0.93335 \cdot f_B$ | $1.163045 \cdot f_B$ | 0.0 | $8.27313 \cdot f_L$ | $4.0000 \cdot f_L$ | $2.35964 \cdot f_L$ | 1.5 | 1.5 |
| 3 | 0.0 | 40° | $0.992103 \cdot f_B$ | $1.399417 \cdot f_B$ | 0.0 | $9.76606 \cdot f_L$ | $4.0000 \cdot f_L$ | $2.1893 \cdot f_L$ | | |
| 4 | 0.0 | 45° | $0.95655 \cdot f_B$ | $1.212478 \cdot f_B$ | 0.0 | $8.44976 \cdot f_L$ | $4.0000 \cdot f_L$ | $2.22646 \cdot f_L$ | 1.1 | 1.2 |
| 5 | 0.0 | 50° | $0.888582 \cdot f_B$ | $1.016263 \cdot f_B$ | 0.0 | $7.42979 \cdot f_L$ | $4.0000 \cdot f_L$ | $2.28583 \cdot f_L$ | | |
| 6 | 0.0 | 34° | $0.89449 \cdot f_B$ | $1.60756 \cdot f_B$ | 0.0 | $19.02918 \cdot f_L$ | $4.0000 \cdot f_L$ | $1.96096 \cdot f_L$ | 0 | 0 |
| 7 | 0.0 | 40° | $0.855973 \cdot f_B$ | $1.446301 \cdot f_B$ | 0.0 | $13.34168 \cdot f_L$ | $4.0000 \cdot f_L$ | $1.94969 \cdot f_L$ | 0 | 0 |
| 8 | 0.0 | 45° | $0.821607 \cdot f_B$ | $1.276782 \cdot f_B$ | 0.0 | $10.05662 \cdot f_L$ | $4.0000 \cdot f_L$ | $1.95589 \cdot f_L$ | | 0 |
| 9 | 0.0 | 50° | $0.783505 \cdot f_B$ | $1.075348 \cdot f_B$ | 0.0 | $7.64739 \cdot f_L$ | $4.0000 \cdot f_L$ | $1.99376 \cdot f_L$ | 0 | 0 |
| 10 | 0.0 | 55° | $0.73329 \cdot f_B$ | $0.855829 \cdot f_B$ | 0.0 | $5.94836 \cdot f_L$ | $4.0000 \cdot f_L$ | $2.10648 \cdot f_L$ | 0 | 0 |

We claim:

1. In a corpuscular beam microscope having a longitudinal axis on which a specimen holder is located and about which a combined condenser and objective magnetic lens system is symmetrically disposed for producing a composite magnetic field along said axis to cause a corpuscular beam to form an angle of at least 30° with said axis at the location of said specimen holder, the improvement wherein said lens system comprises:
   (a) means for producing a first component of said composite magnetic field, said first component having a maximum field strength at a first point on said axis substantially at said location of said specimen holder; and
   (b) means for producing a second component of said composite magnetic field, said second component having a maximum field strength at a second point on said axis, said second point being separated from said first point by a distance less than five times the arithmetic mean of half the half height widths, respectively, of said first component and said second component.

2. The improvement according to claim 1, wherein said means for producing said first component includes a first pole piece defining a first aperture aligned on said axis, and wherein said means for producing said second component includes a second pole piece defining a second aperture aligned on said axis, each said means further including, in common, a third pole piece defining a third aperture aligned with said axis, said third piece being disposed intermediate of and spaced from said first and second pole pieces so as to define between the first and third pole pieces a condenser lens gap in which the maximum field strength of said first component occurs and to define between the third and second pole pieces an objective lens gap in which the maximum field strength of said second component occurs.

3. The improvement according to claim 2, wherein said first and second pole pieces are integral with, and centrally disposed at opposite ends of, a cylinder of superconducting material in which respective superconducting magnet coils for said first pole piece and said second pole piece are housed; and wherein said third pole piece is a ring of superconducting material connected in a vacuum-tight manner by a first annular sealing member of non-superconducting metal to said first pole piece and in a vacuum-tight manner by a second annular sealing member of non-superconducting metal to said second pole piece.

4. In a corpuscular beam microscope having a longitudinal axis on which a specimen holder is located and about which a combined condenser and objective magnetic lens system is symmetrically disposed for producing a composite magnetic field along said axis to cause a corpuscular beam to form an angle of at least 30° with said axis at the location of said specimen holder, the improvement wherein said lens system comprises:
 (a) means defining a first aperture aligned on said axis for producing a first component of said composite magnetic field, said first component having a maximum field strength at a first point on said axis;
 (b) means defining a second aperture aligned on said axis for producing a second component of said composite magnetic field, said second component having a maximum field strength at a second point on said axis separated from said first point;
 (c) a cylinder of superconducting material with which said first and second aperture defining means are integral and at opposite ends of which said first and second aperture defining means are centrally disposed, said cylinder having housed therein respective magnet coils for said first and second aperture defining means; and
 (d) a ring of superconducting material defining a third aperture aligned with said axis, said ring being connected in a vacuum-tight manner by a first annular sealing member of non-super-conducting metal to said first aperture defining means and in a vacuum-tight manner by a second annular sealing member of non-super-conducting metal to said second aperture defining means, a condenser lens gap being formed between said ring and said first aperture defining means in which the maximum field strength of said first component occurs, an objective lens gap being formed between said ring and said second aperture defining means in which the maximum field strength of said second component occurs.

5. A corpuscular beam microscope having a longitudinal axis on which a specimen holder is located, said microscope comprising a combined condenser and objective magnetic lens system having successively coaxially arranged along said axis first, second and third annular pole pieces for producing a composite magnetic field from component fields of the type having an exponential distribution, said composite field having a first field strength maximum of from 0.8886 Tesla units to 0.9921 Tesla units between said first and second pole pieces and a second field strength maximum of from 1.0163 Telsa units to 1.3994 Tesla units between second and third pole pieces, said first and second maxima being separated from one another by a distance of from 7.4298 mm to 9.7661 mm along said axis, the axial location of said specimen holder substantially coinciding with the axial location of said first field strength maximum.

6. A corpuscular beam microscope having a longitudinal axis on which a specimen holder is located, said microscope comprising a combined condenser and objective magnetic lens system having successively coaxially arranged along said axis first, second and third annular pole pieces for producing a composite magnetic field from component fields of the Glaser bell type, said composite field having a first field strength maximum of from 0.7333 Tesla units to 0.8945 Tesla units between said first and second pole pieces and a second field strength maximum of from 0.8558 Tesla units to 1.6076 Tesla units between said second and third pole pieces, said first and second maxima being separated from one another by a distance of from 5.9484 mm to 19.0292 mm along said axis, the axial location of said specimen holder substantially coinciding with the axial location of said first field strength maximum.

* * * * *